United States Patent
Agi

(10) Patent No.: US 8,164,495 B2
(45) Date of Patent: Apr. 24, 2012

(54) INTEGRATED NON-LINEARITY (INL) AND DIFFERENTIAL NON-LINEARITY (DNL) CORRECTION TECHNIQUES FOR DIGITAL-TO-ANALOG CONVERTERS (DACS)

(75) Inventor: Iskender Agi, Redwood City, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/877,904

(22) Filed: Sep. 8, 2010

(65) Prior Publication Data

US 2011/0109487 A1    May 12, 2011

Related U.S. Application Data

(60) Provisional application No. 61/260,801, filed on Nov. 12, 2009, provisional application No. 61/378,321, filed on Aug. 30, 2010.

(51) Int. Cl.
H03M 1/06    (2006.01)
(52) U.S. Cl. .................................. 341/118; 341/144
(58) Field of Classification Search ................ 341/118, 341/155, 163, 120, 75, 144, 161, 156, 172
See application file for complete search history.

(56) References Cited

U.S. PATENT DOCUMENTS

| | | | |
|---|---|---|---|
| 5,495,245 A | 2/1996 | Ashe | |
| 5,999,115 A | 12/1999 | Connell et al. | |
| 6,211,803 B1 | 4/2001 | Sunter | |
| 6,384,763 B1 | 5/2002 | Leung et al. | |
| 7,136,002 B2 | 11/2006 | Dempsey et al. | |
| 7,414,554 B1 | 8/2008 | Tsyrganovich | |
| 7,468,686 B2 | 12/2008 | Brubaker | |
| 7,605,741 B2 * | 10/2009 | Hurrell | ......................... 341/163 |

OTHER PUBLICATIONS

Analog Devices, "LC²MOS 16-Bit Voltage Output DAC", AD7846, 2000, 16 pages.
Hitequest, "DAC Parameters", Apr. 2004, 6 pages.
Kester, Walt, et al., "DACs for DSP Applications", Section 4, 2003, 19 pages.
Maxim, "INL/DNL Measurements for High-Speed Analog-to-Digital Converters (ADCs)", Application Note 283, Sep. 1, 2000, 9 pages.

* cited by examiner

Primary Examiner — Joseph Lauture
(74) Attorney, Agent, or Firm — Fliesler Meyer LLP

(57) ABSTRACT

INL values are determined for a plurality of sub-segments of a DAC that is adapted to accept N bit digital input codes, and a first set of correction codes that can be used to reduce to a range of INL values (to thereby improve linearity of the DAC) are determined and stored. Additionally, DNL values are determined for the plurality of sub-segments for which INL values were determined, and a second set of correction codes that can be used to ensure that all values of DNL>-1 (to thereby ensure that the DAC is monotonic) are determined and stored. This can include using one or more extra bits of resolution to remap at least some of the $2^N$ possible digital input codes (that can be accepted by the DAC) to more than $2^N$ possible digital output codes, to ensure that all values of DNL>-1. Such stored first and second sets are thereafter used when performing digital to analog conversions.

24 Claims, 11 Drawing Sheets

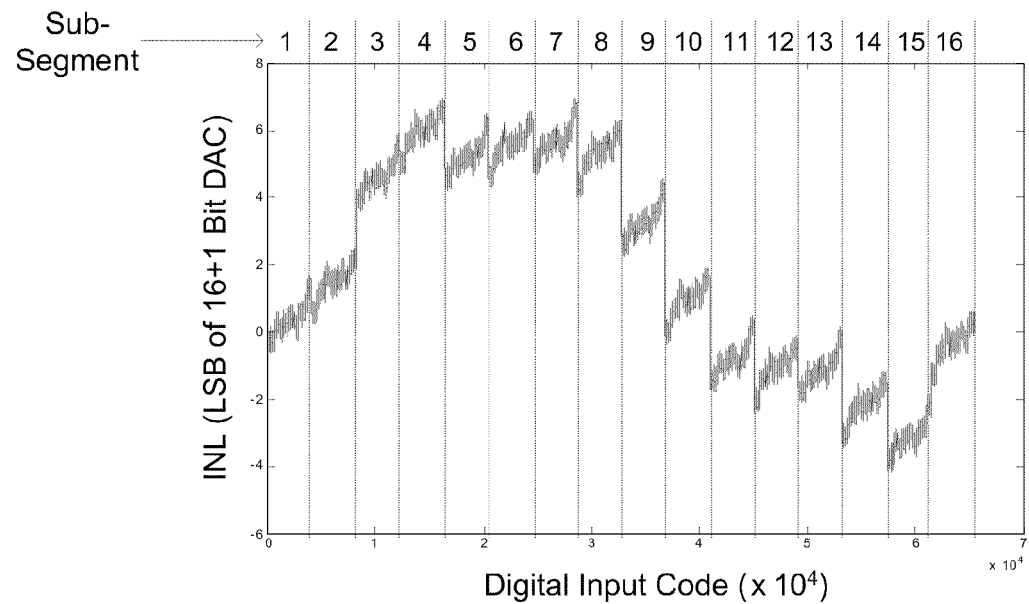
*FIG. 4A*
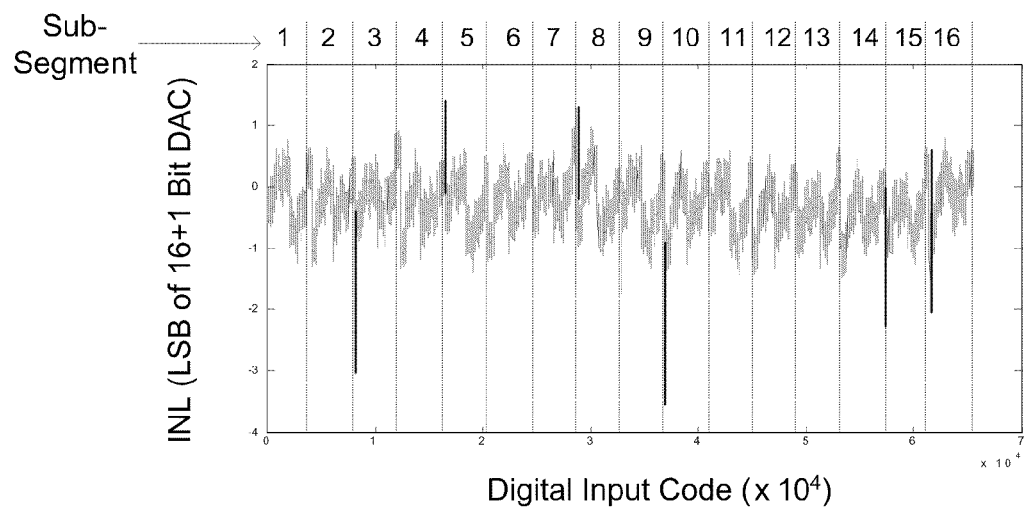

INTEGRATED NON-LINEARITY (INL) AND DIFFERENTIAL NON-LINEARITY (DNL) CORRECTION TECHNIQUES FOR DIGITAL-TO-ANALOG CONVERTERS (DACS)

PRIORITY CLAIM

This application claims priority under 35 U.S.C. 119(e) to U.S. Provisional Application No. 61/260,801, filed Nov. 12, 2009, entitled OFFLINE LINEARITY CORRECTION TECHNIQUE FOR DIGITAL-TO-ANALOG CONVERTERS (DACS), and U.S. Provisional Application No. 61/378,321, filed Aug. 30, 2010, entitled INL AND DNL CORRECTION TECHNIQUES FOR DIGITAL-TO-ANALOG CONVERTERS (DACS), both of which are incorporated herein by reference.

BACKGROUND

A digital-to-analog converter (DAC) is monotonic if the analog output always increases as the value of the digital input code to the DAC increases, and the analog output always decreases as the value of the digital input code to the DAC decreases. Stated another way, a monotonic DAC has an output that changes in the same direction for each increase of the input code. The quality of monotonicity is important in a DAC, especially if the DAC is used in a control loop. This is because when a non-monotonic DAC is used in a control loop, the loop can get stuck (e.g., at a local minimum), which can cause the DAC to toggle forever between a number of input codes.

Two important DAC parameters include Integrated Non-Linearity (INL) and Differential Non-Linearity (DNL), which are defined below.

For a DAC, INL (often called 'relative accuracy') is the deviation of an actual DAC transfer function from a straight line. After nullifying offset and gain errors, depending on implementation, the straight line can either be an ideal line, a best-fit straight line or a line drawn between the end points of the transfer function.

For a DAC, Differential Non-Linearity (DNL) is the difference between the ideal and the measured output responses for successive DAC codes. An ideal DAC response would have analog output values exactly one code (i.e., 1LSB) apart, in which case DNL=0. To ensure that a DAC is monotonic, the DAC must have a negative DNL of less than 1 LSB. Stated another way, a DAC is guaranteed monotonic if the DNL is always greater than −1.

A well known technique for improving the linearity of a DAC is to determine the closest output voltage for a given input code by characterization of the DAC, and storing a correction code in look-up-table (LUT). This technique essentially takes an N bit DAC and remaps the input codes to obtain a trimmed N bit DAC with improved linearity. A challenge for this type of technique is that the LUT can be very large for the general case for any realistic values of N. Additionally, INL optimization can result in DNL values that are less than −1.0, resulting in a non-monotonic DAC, which as mentioned above, is undesirable when used in control loops.

SUMMARY

Certain methods of the present invention are performed during off-line testing of a DAC to improve the linearity of the DAC and ensure that the DAC is monotonic. In accordance with an embodiment, such a method can include determining INL values for a plurality of sub-segments of a DAC that is adapted to accept N bit digital input codes (e.g., N=16), determining a first set of correction codes that can be used to reduce to a range of INL values (to thereby improve linearity of the DAC), and storing the first set of correction codes in non-volatile memory associated with the DAC so that the first set of correction codes can be accessed during digital-to-analog conversions. Additionally, the method can include determining DNL values for the plurality of sub-segments for which INL values were determined, determining a second set of correction codes that can be used to ensure that all values of DNL>−1 (to thereby ensure that the DAC is monotonic), and storing the second set of correction codes in non-volatile memory associated with the DAC so that the second set of correction codes can be accessed during digital-to-analog conversions. This can include using M extra bits of resolution (M is an integer $\geq 1$) to remap at least some of the $2^N$ possible digital input codes (that can be accepted by the DAC) to more than $2^N$ possible digital output codes to ensure that all values of DNL>−1. The DNL values can be determined by measuring or calculating the DNL values presuming that INL correction using the first set of correction codes is performed.

Certain methods of the present invention are for use by a DAC when converting an N bit digital input code to an analog signal. In accordance with an embodiment, such a method can include accepting an N bit digital input code at an input of the DAC, selecting a first correction code from the first set of correction codes based on a predetermined number X (e.g., X=4) of the most significant bits (MSBs) of the N bit digital input code, and selecting a second correction code from the second set of correction codes based on the N bit digital input code. The method can also include producing an N+M bit digital output code (M is an integer $\geq 1$) based on the accepted N bit digital input code, the selected first correction code, and the selected second correction code. Additionally, the method can include converting the N+M digital bit output code to an analog output signal, wherein the analog output signal or a buffered version thereof is the analog output of the DAC. In a specific embodiment, the N+M bit digital output code can be produced by adding the selected first correction code to the accepted N bit digital input code to produce an N bit INL corrected code (INLCC). The N bit INLCC is bit extended to produce an N+M bit INLCC, e.g., by concatenating M 0 bit(s) as LSB(s) to the N bit INLCC. A determination is then made as to whether the N+M bit INLCC requires DNL correction. This can be accomplished by calculating a range of N+M bit INLCCs that would require DNL correction, and determining whether the N+M bit INLCC is within that range. If the N+M bit INLCC requires DNL correction, then the N+M bit INLCC is modified based on a scaled version second correction code to thereby produce the N+M bit digital output code. If the N+M bit INLCC does not require DNL correction, then the N+M bit digital output code equals the N+M bit INLCC.

In such embodiments, the M extra bits of resolution (M is an integer $\geq 1$) is/are used to remap at least some of the $2^N$ possible digital input codes (that can be accepted by the DAC) to more than $2^N$ possible digital output codes, to ensure that all values of DNL>−1. In accordance with specific embodiments, the first set of correction codes is stored as an INL correction look-up table (LUT) in non-volatile memory associated with the DAC, and the second set of correction codes is stored as a DNL correction LUT in non-volatile memory associated with the DAC. In such embodiments the first correction code can be selected from the INL correction LUT based on the predetermined number of the most significant bits (MSBs) of the N bit digital input code, and the second correction code can be selected from the DNL correction LUT based on the same MSBs of the N bit digital input code.

Embodiments of the present invention are also directed to devices, such as DACs or devices including DACs. In accordance with an embodiment, a device includes a code corrector and a raw N+M bit DAC. The code corrector is adapted to accept an N bit digital input code and output an N+M bit digital output code based on the N bit digital input code. The N+M bit DAC is adapted to accept the N+M bit digital code output by the code corrector and output an analog signal based on the accepted N+M bit digital code. In accordance with an embodiment, the code corrector includes a first LUT adapted to store a first set of correction codes used to reduce to a range of INL values, and a second LUT adapted to store a second set of correction codes used to ensure that all values of DNL>−1. The code corrector is adapted to select a first correction code from the first LUT based on a predetermined number of the MSBs of the N bit digital input code, and select a second correction code from the second LUT based on the predetermined number of MSBs of the N bit digital input code. The code corrector produces the N+M bit digital output code based on the accepted N bit digital input code, the first correction code selected from the first LUT, and the second correction code selected from the second LUT. For example, the code corrector can add the first correction code selected from the first LUT to the accepted N bit digital input code to produce an N bit INL corrected code (INLCC). The N bit INLCC can be bit extended to N+M bits and the code corrector can determine whether the N+M bit INLCC requires DNL correction. If the N+M bit INLCC requires DNL correction, the code correction can modify the N+M bit INLCC based on a scaled version of the second correction code selected from the second LUT. If the N+M bit INLCC does not require DNL correction, then the code correction can have the N+M bit digital output code equal to the N+M bit INLCC. In an embodiment, the code corrector includes and/or has access to non-volatile memory adapted to store the first LUT and the second LUT.

Further and alternative embodiments, and the features, aspects, and advantages of the embodiments of invention will become more apparent from the detailed description set forth below, the drawings and the claims.

BRIEF DESCRIPTION OF THE DRAWINGS

FIG. 4A shows an exemplary INL curve for a raw, uncorrected 16+1 Bit DAC.

FIG. 4B shows a corrected INL curve, for the DAC represented in FIG. 4A, using a simple zeroth-order INL correction technique in accordance with an embodiment of the present invention.

DETAILED DESCRIPTION

For INL correction, a number of techniques to reduce the effects of INL can be used that result in different trade-offs as they relate to computational requirements, and on-chip storage. As will be described in more detail below, in an embodiment, one correction code can be determined for each sub-segment (except the end sub-segments to eliminate inadvertent gain errors created by the INL correction) of the most significant segment of the DAC (e.g., segment 110_1 in FIG. 1). Various correction techniques can be used, including, but not limited to, zeroth-order correction (essentially an INL offset correction), or first-order correction (linear fit between major inflection points in the INL curve).

Specific embodiments of the present invention relate to systems, devices and methods that use LUTs to reduce the INL of a DAC, without modifying the DAC output voltage range, while still providing a monotonic DAC. In certain embodiments, the size of the LUTs are reduced compared to prior art LUTs, and preferably minimized.

Figure 1:
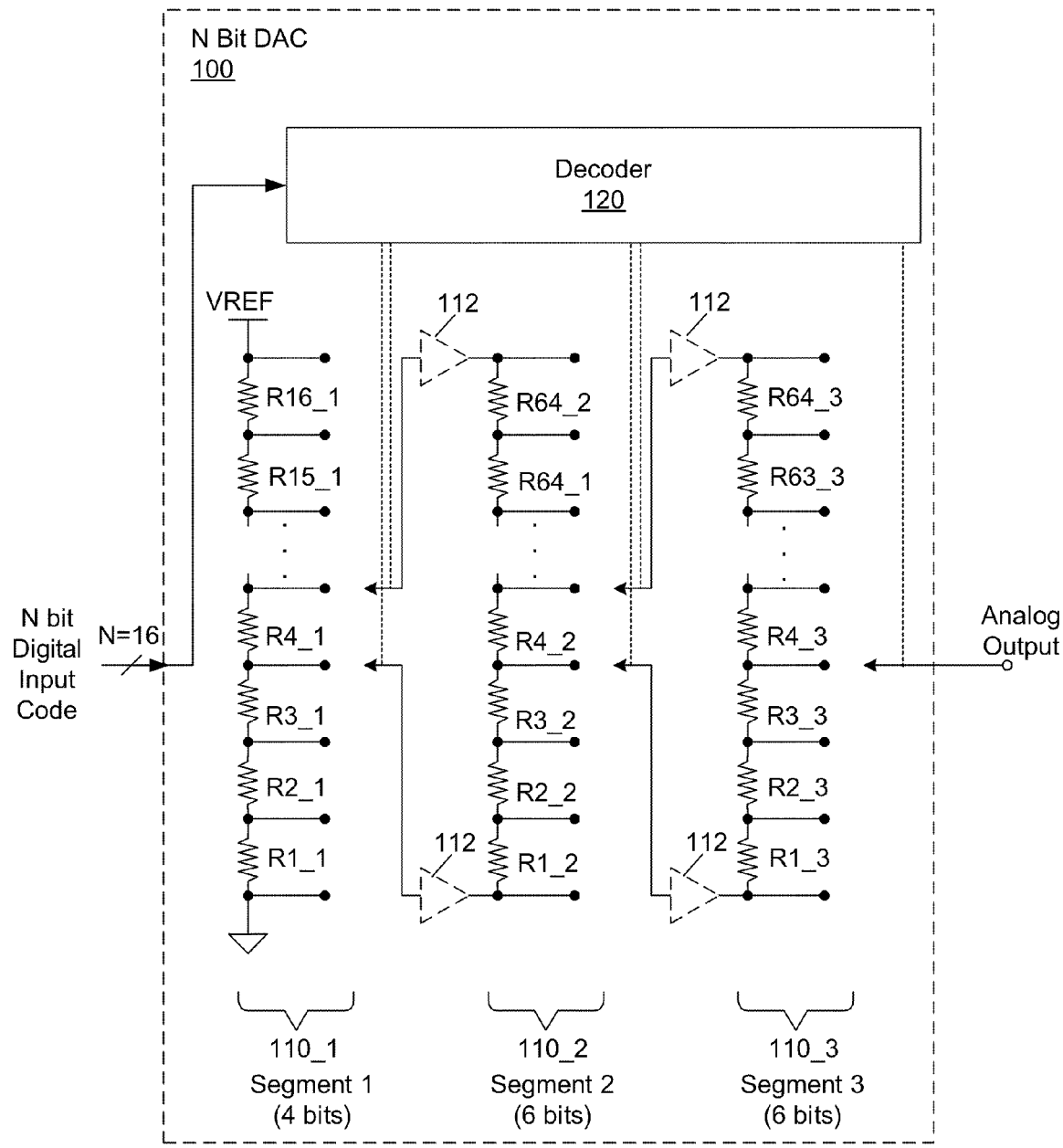
FIG. 1 illustrates an exemplary segmented DAC.

Embodiments of the present invention are useful with various types of DACs, including, but not limited to, segmented DACs. For illustration purposes, an exemplary segmented DAC 100 is shown in FIG. 1. Referring to FIG. 1, a segmented N Bit DAC 100 is shown as including three resistor strings 110_1, 110_2 and 110_3. Each resistor string 110_1, 110_2 and 110_3 can also be referred to as a DAC segment (or simply, a segment).

In the example of FIG. 1, the first segment 110_1 includes 16 equal weighted divider sub-segments (resistors R1_1 through R16_1) which are selectively coupled to the second resistor string 110_2 by switches (not shown) based on the 4 most significant bits (MSBs) of the 16 bit input code to the DAC. The second segment 110_2 includes 64 equal weighted divider sub-segments (resistors R1_2 through R64_2) which are selectively coupled to the third segment 110_3 by switches (not shown) based on the next 6 bits of the 16 bit input code to the DAC. The third resistor string 110_3 includes 64 equal weighted divider sub-segments (resistors R1_3 through R64_3) which are selectively coupled to an output of the DAC by switches (not shown) based on the 6 least significant bits (LSBs) of the 16 bit input code to the DAC. The resistors of the first resistor string 110_1 are weighted the most, and the resistors of the third resistor string 110_3 are weighted the least.

The segmented DAC 100 also includes a decoder 120 that receives the N bit digital input code (e.g., 16 bits) to the DAC, and that controls the switches within the DAC to determine which resistors of the various segments are switched into and out of the circuit to produce an analog voltage at the DAC output. Optional buffers 112 are shown as being included to isolate the various segments. This is just one example of a segmented DAC, which is not meant to be limiting. The exemplary segmented DAC of FIG. 1 has been provided to provide an example of a DAC with which embodiments of the present invention can be used. However, it would be clear to one of ordinary skill in the art reading this description, that embodiments of the present invention can be used with various other types of DACs.

A major-carry transition occurs in a segmented DAC, such as the DAC 100, e.g., when the second most significant DAC segment (e.g., 110_2) is switched into or out of one of the sub-segments (e.g., R1_1 through R1_16) of the most significant DAC segment (e.g., 110_1). Such a DAC may experience non-monotonic behavior at these major-carry transitions because of the mismatch of the sub-segments of the most significant DAC segment.

In accordance with specific embodiments of the present invention, an N+M Bit DAC is used to improve linearity, reduce the effects of INL, and ensure that DNL is always greater than −1 (i.e., greater than or equal to 0, or between −0.999 . . . and 0), to thereby always provide a monotonic DAC.

Figure 2:
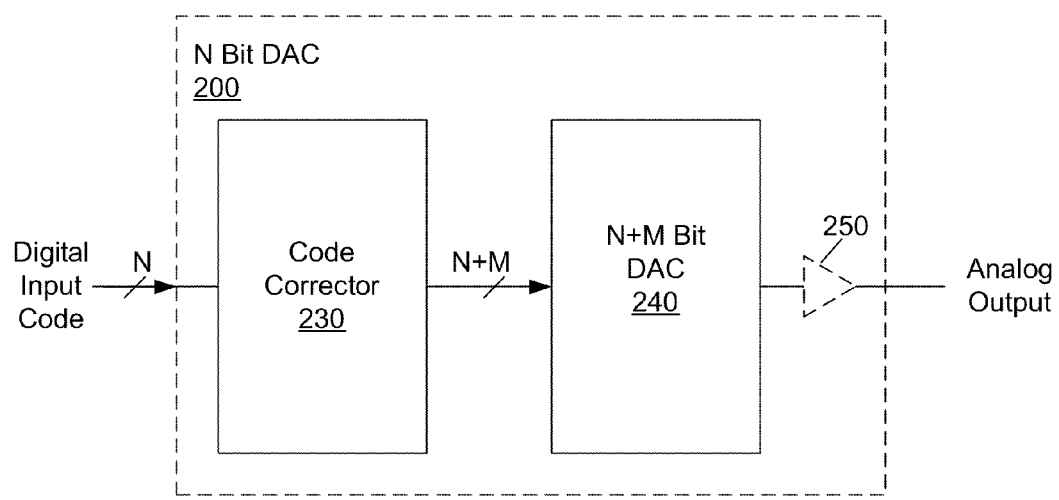
FIG. 2 is a high level diagram that illustrates an N Bit DAC 200, according to such an embodiment of the present invention.

FIG. 2 is a high level diagram that illustrates an N Bit DAC 200, according to such an embodiment of the present invention. As will be described in more detail below, this DAC 200 will be tested and trimmed at test, and correction codes will be stored on-chip in non-volatile memory (e.g., EEPROM, or Fuses), and the correction codes can be read out and processed when necessary, e.g., on start-up and on DAC input code write.

Figure 3A:
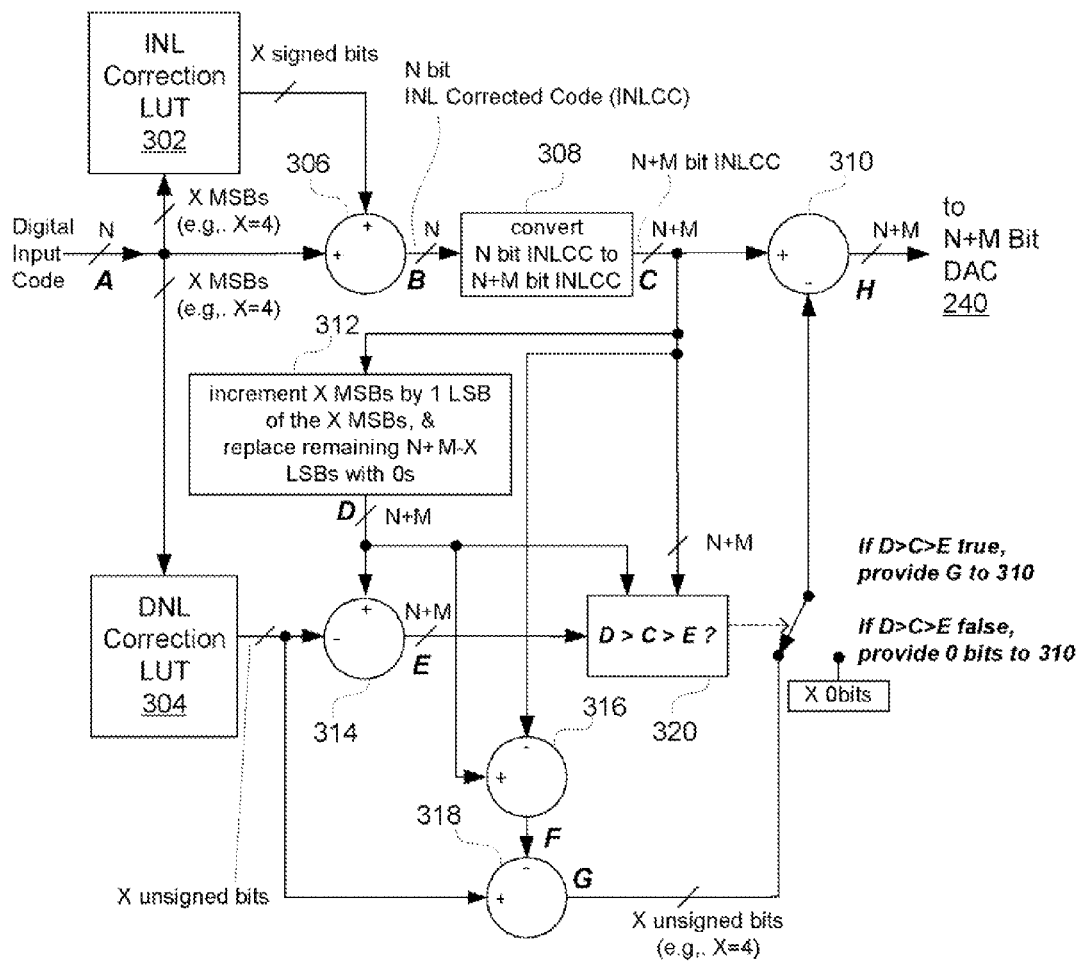
FIG. 3A illustrates details of the code corrector of FIG. 2, according to an embodiment of the present invention.
Figure 3B:
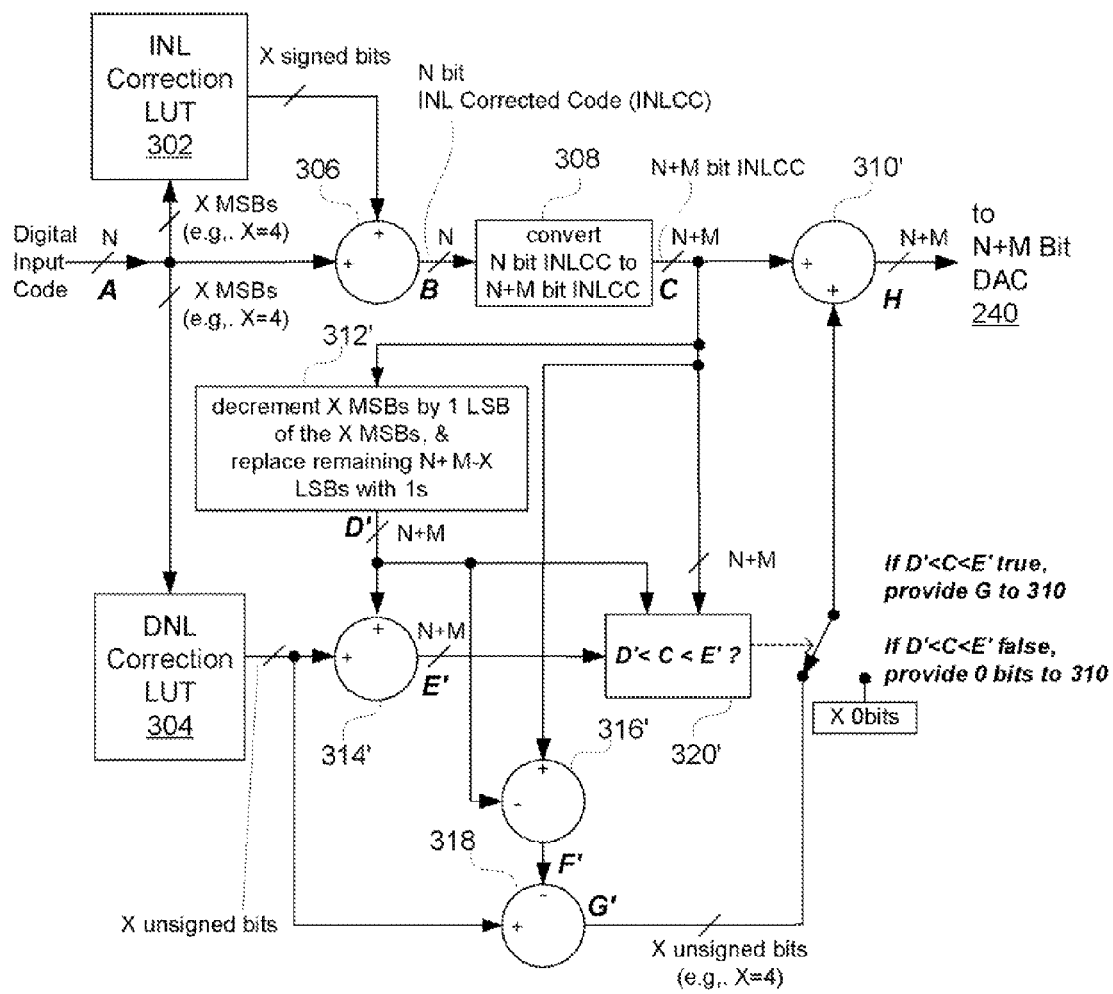
FIG. 3B illustrates details of the code corrector of FIG. 2, according to another embodiment of the present invention.

Referring to FIG. 2, the N Bit DAC 200 includes a code corrector 230 and a N+M Bit DAC 240, where M is an integer that is greater than or equal to 1. An optional buffer 250 can also be added at the output of the N+M Bit DAC 240 (either within the N Bit DAC 200 are external the N Bit DAC 200). Additional details of the code corrector 230, according to embodiments of the present invention, are shown in FIGS. 3A and 3B. For example, the N+M Bit DAC 240 can resemble the N Bit DAC shown in FIG. 1, but with $2^{6+M}$ resistors in the least significant segment 110_3. For example, if M=1, then segment 110_3 can include $2^7$ (i.e., 128) resistors instead of $2^6$ (i.e., 64) resistors, and the other segments (110_1 and 110_2) can be the same as shown in FIG. 1.

Code Corrector

Referring to FIGS. 2 and 3A, the N Bit digital input code (labeled A) that is received by the N Bit DAC 200 is provided to the code corrector 230.

Referring to FIG. 3A, in accordance with an embodiment the code corrector 230 includes an INL correction LUT 302 and a DNL correction LUT 304. The INL correction LUT 302 stores INL correction codes, and the DNL correction LUT 304 stores DNL correction codes. Exemplary techniques for generating the INL correction codes are described below with reference to FIGS. 4A and 4B. Exemplary techniques for generating the DNL correction codes are described below with reference to FIGS. 5A, 5B, 6 and 7.

Referring to FIG. 3A, a predetermined number X of the most significant bits (MSBs) of the N Bit digital input code (labeled A) are used by the INL Correction LUT 302 to select an INL correction code (e.g., X=4). In an embodiment, the INL correction code includes X signed bits, where the most significant bit (MSB) of the X signed bits indicates whether the code is positive or negative. This INL correction code, selected using the INL correction LUT 302, is added to the N Bit digital input code (labeled A), by an adder 306, to produce an INL corrected code (INLCC) (labeled B), which is still N bits. The N bit INLCC (labeled B) is converted to an N+M bit INLCC (labeled C) by bit extending the N bit code to an N+M bit code. This can be accomplished by concatenating M 0 bit(s), as the least significant bit(s) (LSB(s)), to the N bit INLCC. In accordance with an embodiment, M=1. However, M can alternatively be other integers greater 1. In accordance with an embodiment, the predetermined number X (i.e., the number of MSBs used by the LUT 302) is dependent on the number of sub-segments (e.g., R1_1-R16_1 in FIG. 1) in the most significant DAC segment (e.g., 110_1 in FIG. 1). More specifically, X=log 2(the number of sub-segments in the most significant segment). Thus, for the exemplary segmented DAC 100 of FIG. 1, X=log 2(16)=4.

The N+M bit INLCC (labeled C) is provided to a subtractor 310 to produce the N+M bit output code (labeled H) that is provided to the N+M Bit DAC 240 (shown in FIG. 2). If the N+M bit INLCC (labeled C) corresponds to a non-monotonic portion of a transfer curve for the INL corrected DAC, then DNL correction is needed, in which case a subtractor 310 subtracts X unsigned bits (labeled G) from the N+M bit INLCC (labeled C), causing H=C−G. As will be described below with reference to FIGS. 6 and 7, this essentially remaps the N+M bit INLCC (labeled C) down the transfer curve so as to avoid the non-monotonic portion of the transfer curve. The extra M bit(s) of resolution allows this to take place. If the N+M bit INLCC (labeled C) corresponds to a monotonic portion of a transfer curve for the INL corrected DAC, then no DNL correction is needed, and the subtractor 310 subtracts X 0 bits (e.g., four 0 bits) from the N+M bit INLCC (labeled C), causing the N+M bit output code (labeled H) to equal the N+M bit INLCC (labeled C).

In accordance with an embodiment, the X unsigned bits (labeled G) used for DNL correction can be generated as described below.

Still referring to FIG. 3A, the predetermined number X of the MSBs of the N Bit digital input code are also used by the DNL Correction LUT 304 to select a DNL correction code. In an embodiment, the DNL correction code includes X unsigned bits (e.g., X=4).

As indicated by block 312, the X MSBs of the N+M bit INLCC (labeled C) are incremented by 1 LSB of the X MSBs, and the remaining N+M-X LSBs of the N+M bit INLCC are replaced with 0 bits, to produce an N+M bit code (labeled D). For example, assuming N=16, M=1, X=4 and the N+M bit INLCC (labeled C) is 01101010101010101, then the N+M bit code (labeled D) would be 01110000000000000. In other words, the 4 MSB 0110 are incremented by 1 LSB of the 4 MSBs to be 0111, and the remaining 14 LSBs 1010101010101 are replaced with 0 bits to be 0000000000000, resulting in 01110000000000000. The N+M bit code (labeled D) corresponds to the next higher code value that causes a major-carry transition.

The DNL correction code, selected using the DNL correction LUT 304, is subtracted from to the N+M Bit code (labeled D), by a subtractor 314, to produce an N+M bit code (labeled E). The N+M Bit code (labeled D) and N+M bit code (labeled E) define a range of code values that corresponds to a non-monotonic portion of the INL corrected DAC transfer curve, with the code D being the low end of the range and the code E being the high end of the range. In other words, if the INLCC (labeled C) has a value such that D>C>E, then DNL correction is necessary.

The N+M bit INLCC (labeled C) is subtracted from the N+M Bit code (labeled D), by a subtractor 316, to produce an N+M bit code (labeled F), which specifies how far the INLCC (labeled C) is below the code D. A subtractor 318 subtracts his N+M bit code (labeled F) from to the DNL correction code, selected using the DNL correction LUT 304, to produce X unsigned bits (labeled G). The X unsigned bits (labeled G) are essentially a scaled DNL correction code. For the code correction 230 in FIG. 3A, the scaling of the selected DNL correction code occurs as follows. The closer the N+M bit INLCC (labeled C) is to D, the smaller F is, causing the value of G to close to the value of the selected DNL correction code (because only a small F is subtracted from the selected DNL correction code to produce G). The further N+M bit INLCC (labeled C) is from D, the larger F is, causing the value of G to much less than the selected DNL correction code (because a larger F is subtracted from the selected DNL correction code to produce G).

When necessary, the X unsigned bits (labeled G) are used to remap the N+M bit INLCC (labeled C) down the transfer curve so as to avoid a non-monotonic portion of the transfer curve. More specifically, at block 320 there is a determination of whether D>C>E is true or false. If D>C>E is true, this means that N+M bit INLCC (labeled C) should be remapped down the transfer curve so as to avoid a non-monotonic portion of the transfer curve. This is accomplished by subtracting the X unsigned bits (labeled G) from the N+M bit INLCC (labeled C) to produce the N+M bit output code (labeled H) that is provided to the N+M Bit DAC 240. If at block 320 there is a determination of that D>C>E is false, this means that N+M bit INLCC (labeled C) corresponds to a monotonic portion of a transfer curve for the INL corrected DAC, and no DNL correction is needed, in which case the subtractor 310 subtracts X 0 bits (e.g., four 0 bits) from the N+M bit INLCC (labeled C), causing the N+M bit output code (labeled H) to equal the N+M bit INLCC (labeled C).

The DNL correction described with reference to FIG. 3A corresponds to a "back-up and slow-grow" DNL correction technique, which is explained in additional detail below. Instead of using the "back-up and slow-grow" DNL correction technique, a "go-forward and slow-grow" DNL correction technique can be used, which is also explained in additional detail below. The code corrector 230' shown FIG. 3B corresponds to the "go-forward and slow-grow" DNL correction technique. Components in FIG. 3B that are the same as in FIG. 3A are labeled the same. Where components in FIG. 3B have been changed in comparison to FIG. 3A, the component is labeled with a same number followed by a prime (e.g., 320 is changed to 320'). A comparison between FIGS. 3B and 3A shows, e.g., some subtractors have been changed to adders, as well as other changes. In both FIGS. 3A and 3B: A is a N bit Digital Input Code; B is a N bit INL Corrected Code (IN-LCC); C is a N+M bit INLCC (i.e., a bit extended INLCC); and H is a N+M bit code equal to C, or equal to C-G (depending on whether D>C>E). In FIG. 3A: D is a N+M bit code having X MSBs equal to the X MSBs of C incremented by 1 LSB of the X MSBs, and with the remaining N+M-X LSBs all 0s; E is a N+M bit code equal to D—DNL Correction Code; F is a X bit code equal to E-C; and G is a X bit code equal to DNL Correction Code—F. In FIG. 3B: D' is a N+M bit code having X MSBs equal to the X MSBs of C decremented by 1 LSB of the X MSBs, and with the remaining N+M-X LSBs all 1s; E' is a N+M bit code equal to D'—DNL Correction Code; F' is a X bit code equal to E'-C; and G' is a X bit code equal to DNL Correction Code—F'.

Exemplary Illustration of INL Correction

To illustrate the effects of an INL correction technique of an embodiment of the present invention, this correction technique was applied to an N=16, and M=1 (i.e., a 16+1 Bit segmented DAC). For example, a 16+1 Bit DAC can resemble the N bit DAC 100 shown in FIG. 1, but with $2^7$ (i.e., 128) resistors, instead of $2^6$ (i.e., 64) resistors, in the least significant segment 110_3, and the other segments 110_1 and 110_2 being the same as shown in FIG. 1. This was also explained above.

FIG. 4A shows an exemplary INL curve for a raw, uncorrected 16+1 Bit DAC. In FIG. 4A the maximum positive INL is about +7 (for sub-segments 4 and 7), and the maximum negative INL (i.e., the most negative INL) is about −4 (for sub-segment 15). Thus, the INL can be said to have a [+7, −4] range.

In accordance with an embodiment, to correct the INL a zeroth-order (or greater order) correction is used to correct the non-end sub-segments of the most significant segment. For example, referring to FIG. 1, segment 110_1 is the most significant segment, which includes 16 sub-segments. Thus, in accordance with an embodiment, a correction code can be determined for each of the non-end sub-segments (i.e., the 14 middle sub-segments) of segment 110_1. In other words, correction for INL is performed on all sub-segments, of the most significant segment, except the end sub-segments. The end segments remain uncorrected to assure the use of the voltage range of the DAC.

In accordance with an embodiment, INL correction codes are calculated by taking the negative of the average (of all the codes, or just minimum and maximum values) of the INL values measured for each sub-segment having its INL corrected. Referring to the INL curve of FIG. 4A, it can be seen that for sub-segment 2 the average INL is about +1, for sub-segment 3 the average INL is about +5, for sub-segment 4 the average INL is about +6 . . . for sub-segment 14 the average INL is about −2, and for sub-segment 15 the average INL is about −3. Accordingly, the corrections for the DAC whose INL is shown in FIG. 4A could be: [0, −1, −5, −6, . . . , +2, +3, 0]. If each correction code is 4 bits, and 14 corrections codes are being stored (because none need be stored for the end sub-segments), then a total of 4×14=56 INL correction bits may be stored. In this example, these 56 INL correction bits would be, or be included in, the INL correction LUT 302 in FIGS. 3A and 3B.

FIG. 4B shows a corrected INL curve (for the DAC previously represented in FIG. 4A) using a simple zeroth-order correction technique. FIG. 4B illustrates that the INL has been reduced from a [+7, −4] range for the raw DAC represented in FIG. 4A, to a [+1.5, −3.5] range, which is a drop of a factor of about 2.

Exemplary Illustration of DNL Correction

Figure 5A:
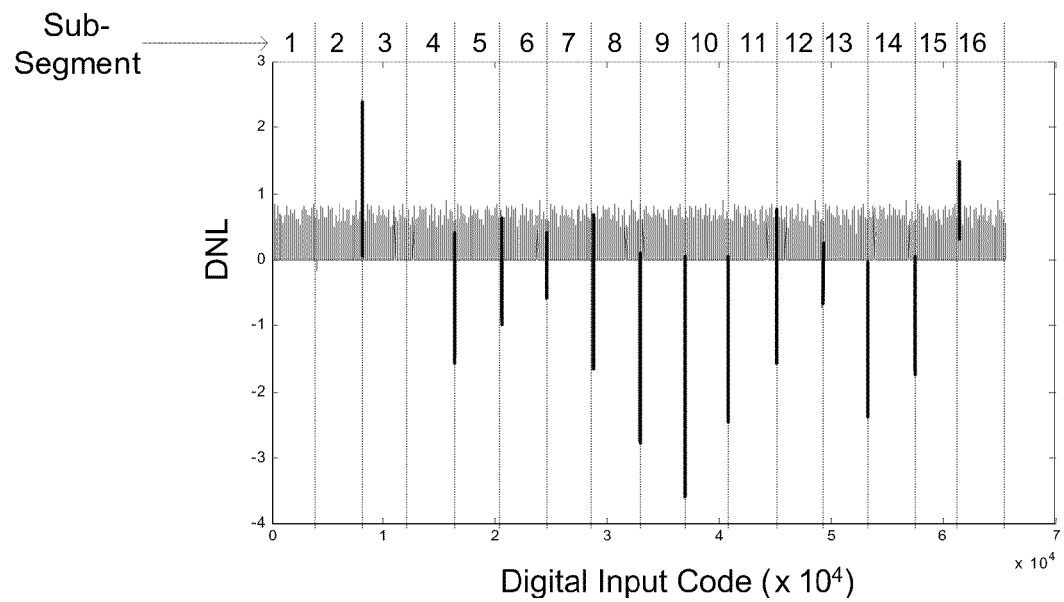
FIG. 5A shows an exemplary DNL curve, for the DAC represented in FIG. 4A, after the INL correction in accordance with an embodiment of the present invention.

FIG. 5A shows an exemplary DNL curve for the same 16+1-bit DAC after the INL correction described above. At this point, the DAC can be referred to as an INL corrected DAC. Notice that there are many negative DNL spikes that are more negative than −1 that would make this DAC non-monotonic. In accordance with an embodiment, a "back-up and slow-grow" or "go-forward and slow-grow" DNL correction technique is used to correct for the negative DNL spikes that would make the DAC non-monotonic by using the extra resolution of the N+M bit DAC to compress the codes before the negative DNL event, to avoid the negative DNL event all together.

Figure 5B:
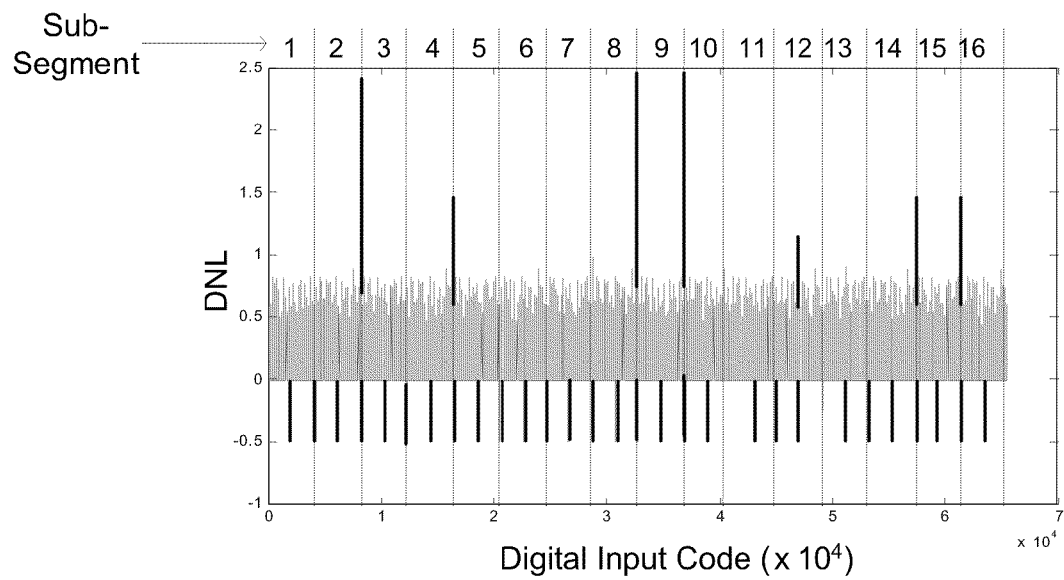
FIG. 5B shows a corrected DNL curve, for the DAC represented in FIG. 4A, using simple zeroth-order correction INL correction technique combined with a "back-up and slow-grow" DNL correction technique in accordance with an embodiment of the present invention.

FIG. 5B shows the DNL for a DAC that has been both INL and DNL corrected using the techniques described herein. More specifically, FIG. 5B shows a corrected DNL curve using simple zeroth-order correction INL correction technique combined with the "back-up and slow-grow" DNL correction technique. Notice that there are many more negative DNL points as compared to FIG. 4B. These negative DNL events are a result of both inherent DNL of the raw DAC, and the results of the negative DNL introduced by the INL and DNL correction techniques described above. However, beneficially, the DNL range has been reduced from a [+2.5, −3.5] range to a [+2.5, −0.5] range, a drop by factor of about 2 relative to the uncorrected DAC. In this example, the DNL correction requires another 4×14=56 bits for DNL correction. In this example, these 56 DNL correction bits would be, or be included in, the DNL correction LUT 304 in FIGS. 3A and 3B.

FIG. 5B shows a corrected DNL curve using simple zeroth-order correction INL correction technique combined with the "back-up and slow-grow" DNL correction technique, which will now be described.

In accordance with an embodiment, the "back-up and slow-grow" DNL correction technique begins with measuring or calculating the DNL of an INL corrected DAC. FIG. 5A, mentioned above, illustrates a measured or calculated DNL for an INL corrected DAC. If the DNL is more negative than −1, one or more N+M bit INLCC(s) is/are remapped down the transfer curve and compacted so as to avoid the DNL<−1 event in the transfer curve. This can be done because of the over-provisioning, i.e., the extra M-bit(s) of resolution, of the N+M-bit DAC.

Figure 6:
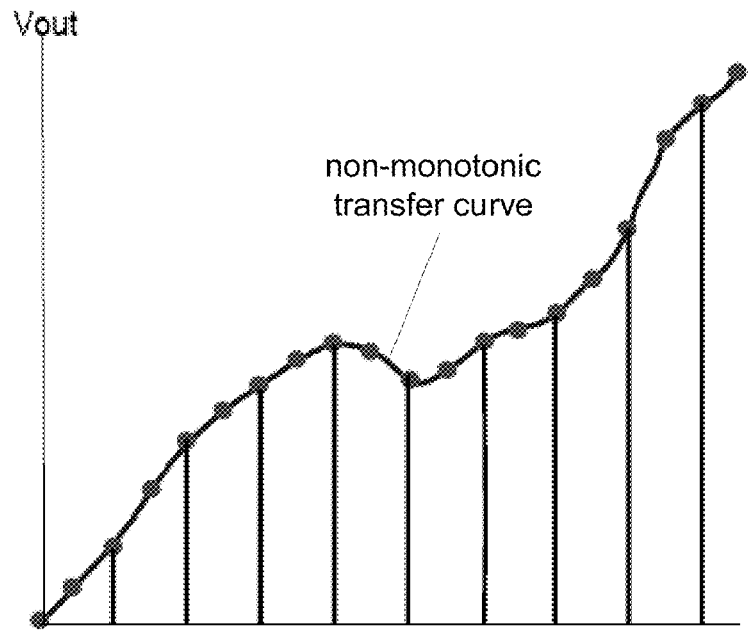
FIG. 6 shows a non-monotonic transfer curve for a DAC that has been INL corrected in accordance with an embodiment of the present invention, but not yet DNL corrected.
Figure 7:
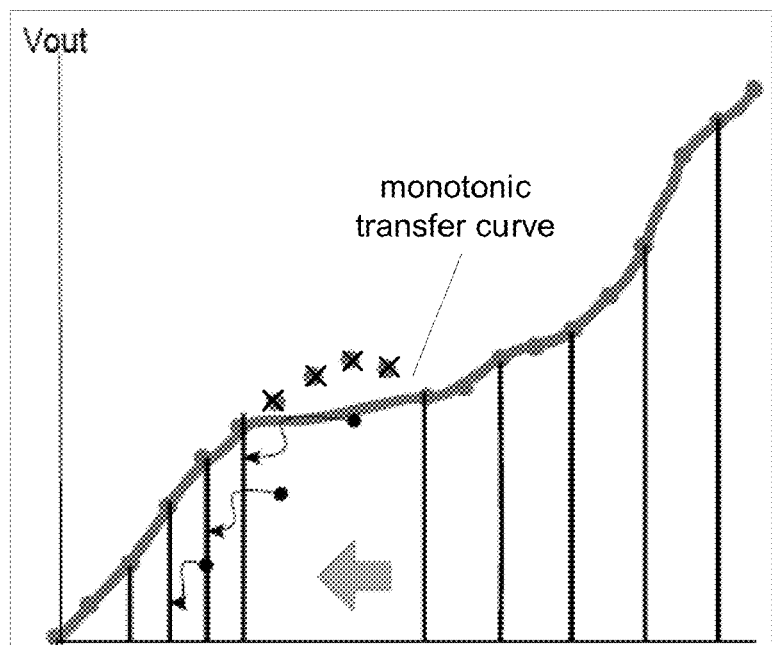
FIG. 7 shows a monotonic transfer curve for a DAC that has been INL corrected, as well as DNL corrected using a back-up and slow grow technique of an embodiment of the present invention.

FIGS. 6 and 7 will now be used to better illustrate the "back-up and slow-grow" technique. FIG. 6 illustrates a transfer curve for a DAC that has been INL corrected, but has not yet been DNL corrected. As can be appreciated from FIG. 6, the INL corrected DAC has a non-monotonic transfer function, i.e., it has DNL<−1. FIG. 7 illustrates that the raw codes can be remapped just before the DNL<−1 event to lower codes in the N+M DAC, by compressing the increment, resulting in a transfer function that is monotonic. In FIG. 7, three raw codes were remapped to achieve a monotonic DAC. An alternative but similar approach can be used to remap the codes up the transfer curve (as opposed to down the transfer curve as in FIG. 7) and similarly compressing the remapped codes. This alternative technique can be referred to as the "go-forward and slow-grow" technique and will yield equivalent monotonic results. The code corrector 230' in FIG. 3B can be used to implement the "go-forward and slow-grow" technique.

The below exemplary correction procedure, written in pseudo-Matlab code, was used to test the INL and DNL correction techniques of specific embodiments of the present invention:

```
%% Calculate Non-Linearities %%
[inl, dnl] = Calc_NL(dac_raw);
%% Calculate Correction and Correct INL %%
%% Ex: uses zeroth-order average of Min. & Max. INL / segment %%
for segment = 1 : (2^(inl_msb) − 2),
    bgn_ind = segment * 2^(inl_lsb) + 1;
    end_ind = (segment + 1) * 2^(inl_lsb);
    max_inl = max( inl(bgn_ind : end_ind) );
    min_inl = min( inl(bgn_ind : end_ind) );
    inl_adj = ceil(inl_gain * (max_inl + min_inl));
    code_lut(bgn_ind : end_ind) =
                    code_lut(bgn_ind : end_ind) − inl_adj;
end
%% Calculate Non-Linearities for INL-corrected DAC%%
[inl, dnl] = Calc_NL( code_lut(dac_raw) );
%% Calculate Correction and Correct DNL %%
for x=1:(length(code_lut)),
        if (dnl(x) < −0.5 )
correction = 2*ceil(−dnl(x));
%% back-up and slow-grow %%
for y = 0:floor(dnl_gain * correction),
code_lut(x − y) = code_lut(x − y)
                    − floor((correction − y));
end
end
end
```

Figure 8:
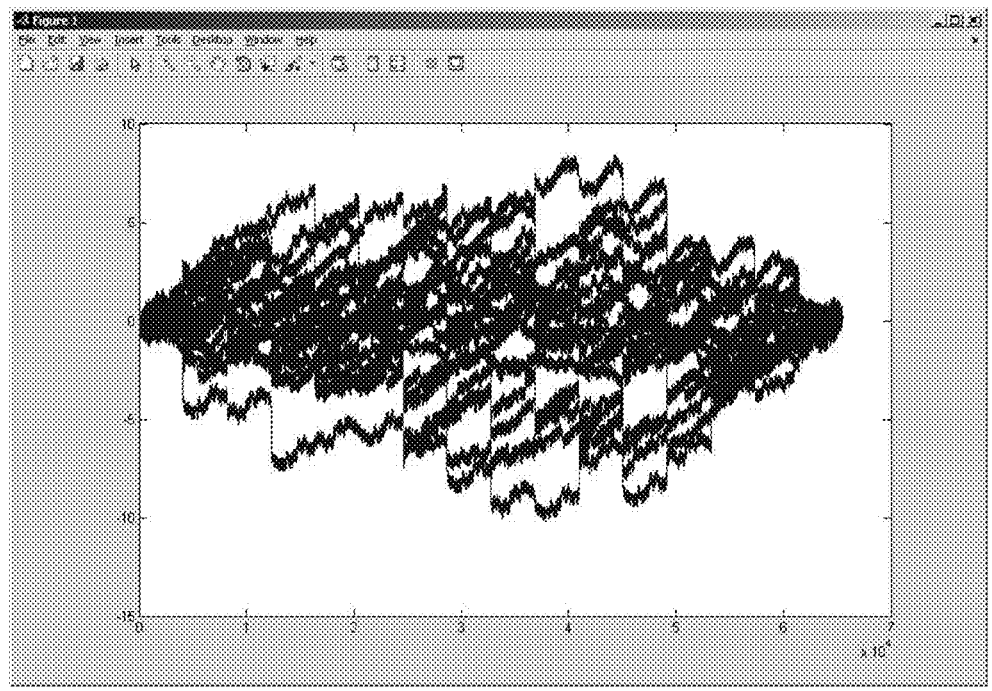
FIG. 8 illustrates a combined INL curve for 20 DACs.
Figure 9:
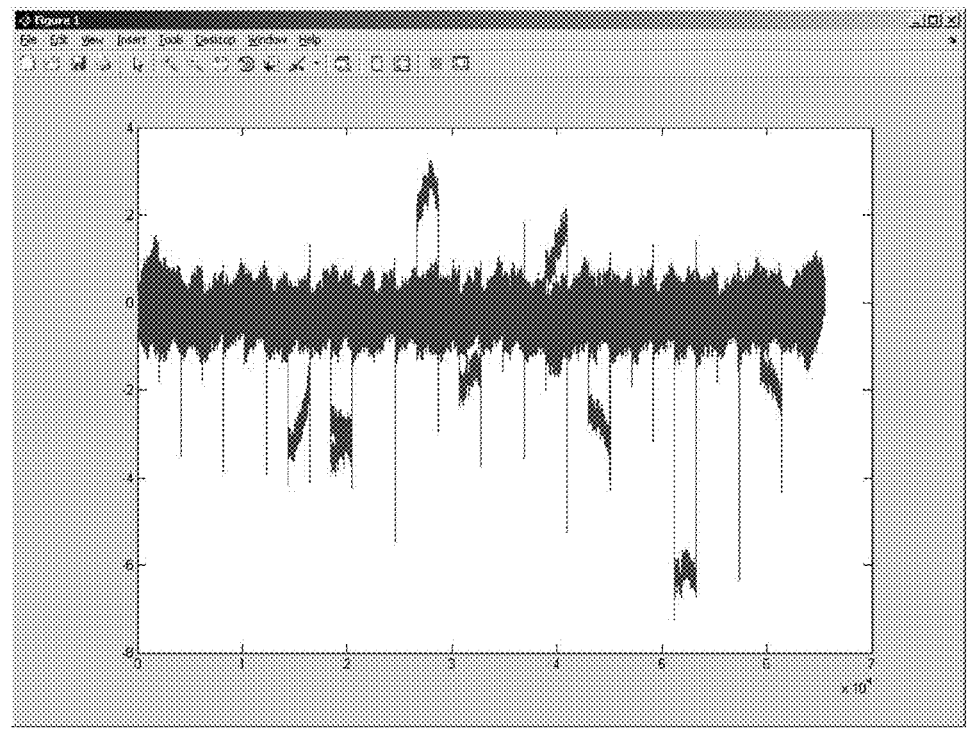
FIG. 9 illustrates a combined corrected INL curve for the same 20 DACs represented in FIG. 8, showing a factor of about 2 improvement in INL obtained using an embodiment of the present invention.
Figure 10:
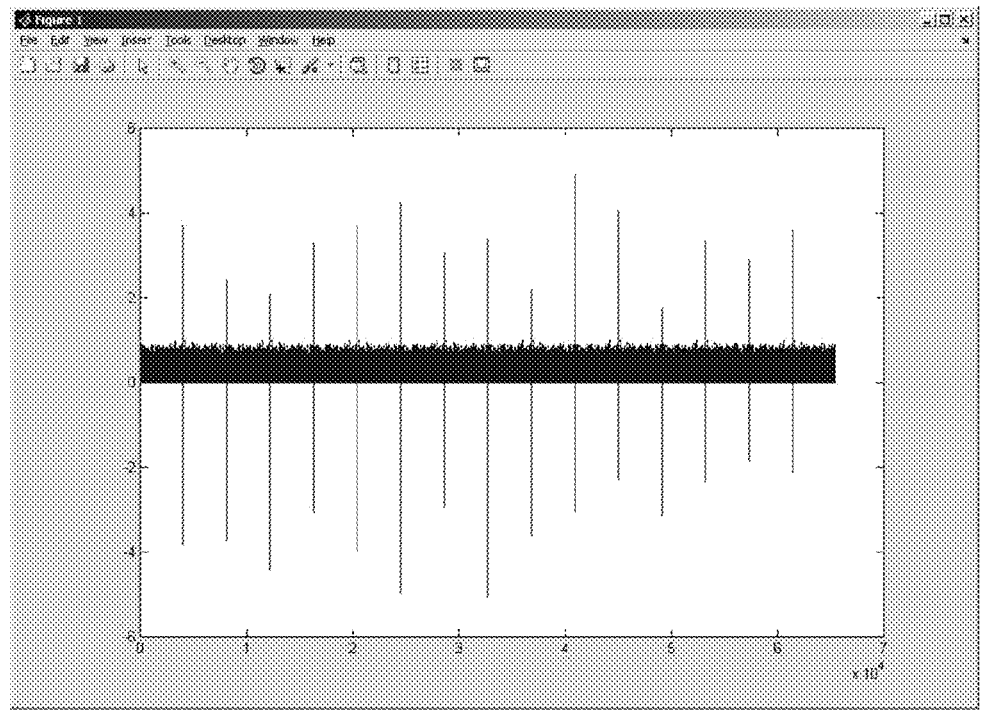
FIG. 10 illustrates a combined DNL curve for the same 20 DACs represented in FIGS. 8 and 9.
Figure 11:
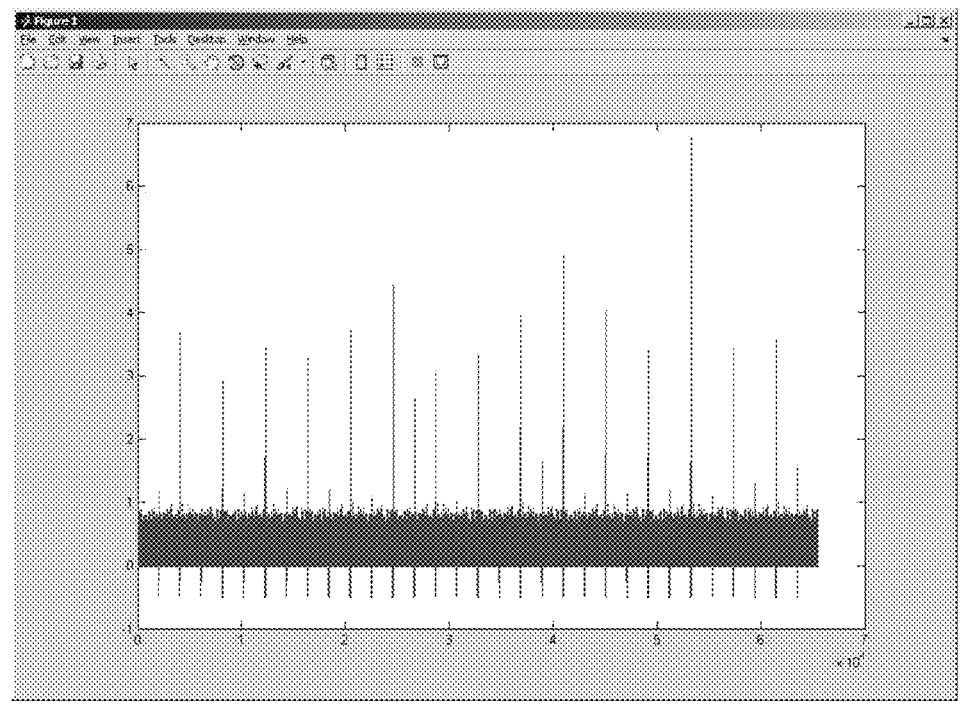
FIG. 11 illustrates a combined corrected DNL curve for the same 20 DACs represented in FIG. 8, showing a factor of about 2 improvement in DNL obtained using an embodiment of the present invention.

Monte-Carlo simulations were performed for 20 different DAC sample curves. FIG. 8 illustrates a combined INL curve for 20 DACs (that were not yet INL corrected). FIG. 9 illustrates a combined corrected INL curve for the same 20 DACs (after they were INL corrected using an embodiment of the present invention), showing a factor of about 2 improvement in INL. FIG. 10 illustrates a combined DNL curve for the same 20 DACs (that were not yet DNL corrected). FIG. 11 illustrates a combined corrected DNL curve for the same 20 DACs (after they were DNL corrected using an embodiment of the present invention), showing a factor of about 2 improvement in DNL.

Embodiments of the present invention provide INL and DNL correction techniques for M+N bit DACs. Simulations have shown excellent results in improving INL and DNL performance using the extra resolution in a 16+1-bit DAC. The example shown is consistent with the level of improvement for Monte Carlo simulations.

Figure 12:
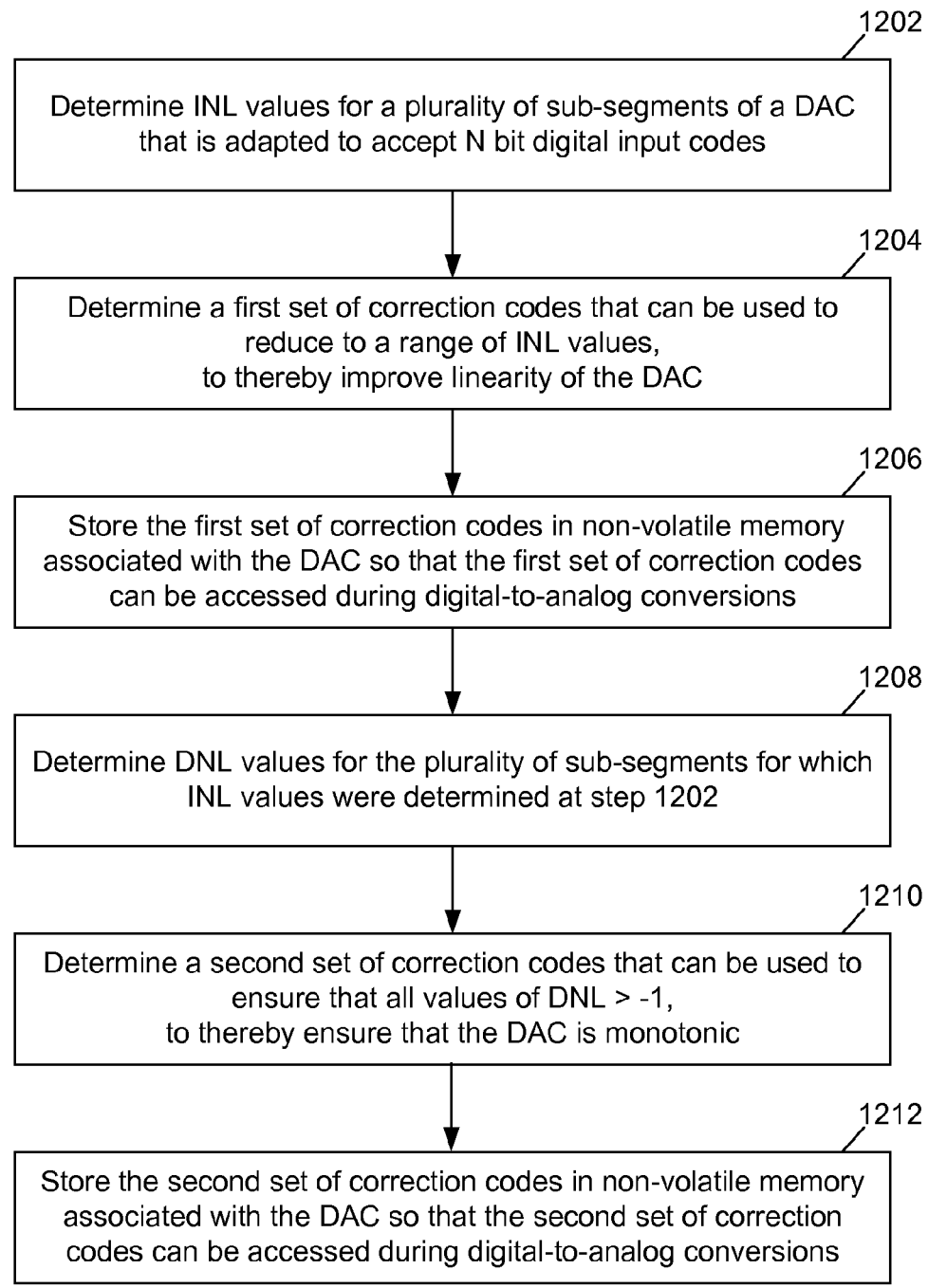
FIG. 12 is a high level diagram that is used to summarize a method performed during off-line testing of a DAC to improve the linearity of the DAC and ensure that the DAC is monotonic, in accordance with an embodiment of the present invention.

FIG. 12 is a high level diagram that is used to summarize a method performed during off-line testing of a DAC to improve the linearity of the DAC and ensure that the DAC is monotonic, in accordance with an embodiment of the present invention. Referring to FIG. 12, at step 1202, INL values are determined (e.g., measured during off-line testing) for a plurality of sub-segments of a DAC that is adapted to accept N bit digital input codes (e.g., N=16). The sub-segments can be, e.g., resistors of a resistor string of a most significant segment of a segmented DAC, e.g., similar to the DAC shown in FIG. 1. At step 1204, there is a determination of a first set of correction codes that can be used to reduce to a range of INL values (to thereby improve linearity of the DAC), and the first set of correction codes are stored (e.g., as a first LUT) at step 1206 in non-volatile memory associated with the DAC so that the first set of correction codes can be accessed during digital-to-analog conversions. At step 1208 there is a determination of DNL values for the plurality of sub-segments for which INL values were determined. Such DNL values can be measured or calculated presuming that INL correction using the first set of correction codes is performed. At step 1210, there is a determination of a second set of correction codes that can be used to ensure that all values of DNL>−1 (to thereby ensure that the DAC is monotonic), and at step 1212 the second set of correction codes are stored (e.g., as a second LUT) in non-volatile memory associated with the DAC so that the second set of correction codes can be accessed during digital-to-analog conversions. To codes stored at steps 1210 and 1212 along with the M extra bits of resolution (M is an integer ≧1) can be used to remap at least some of the 2^N possible digital input codes that can be accepted by the DAC to ensure that all values of DNL>−1.

Figure 13:
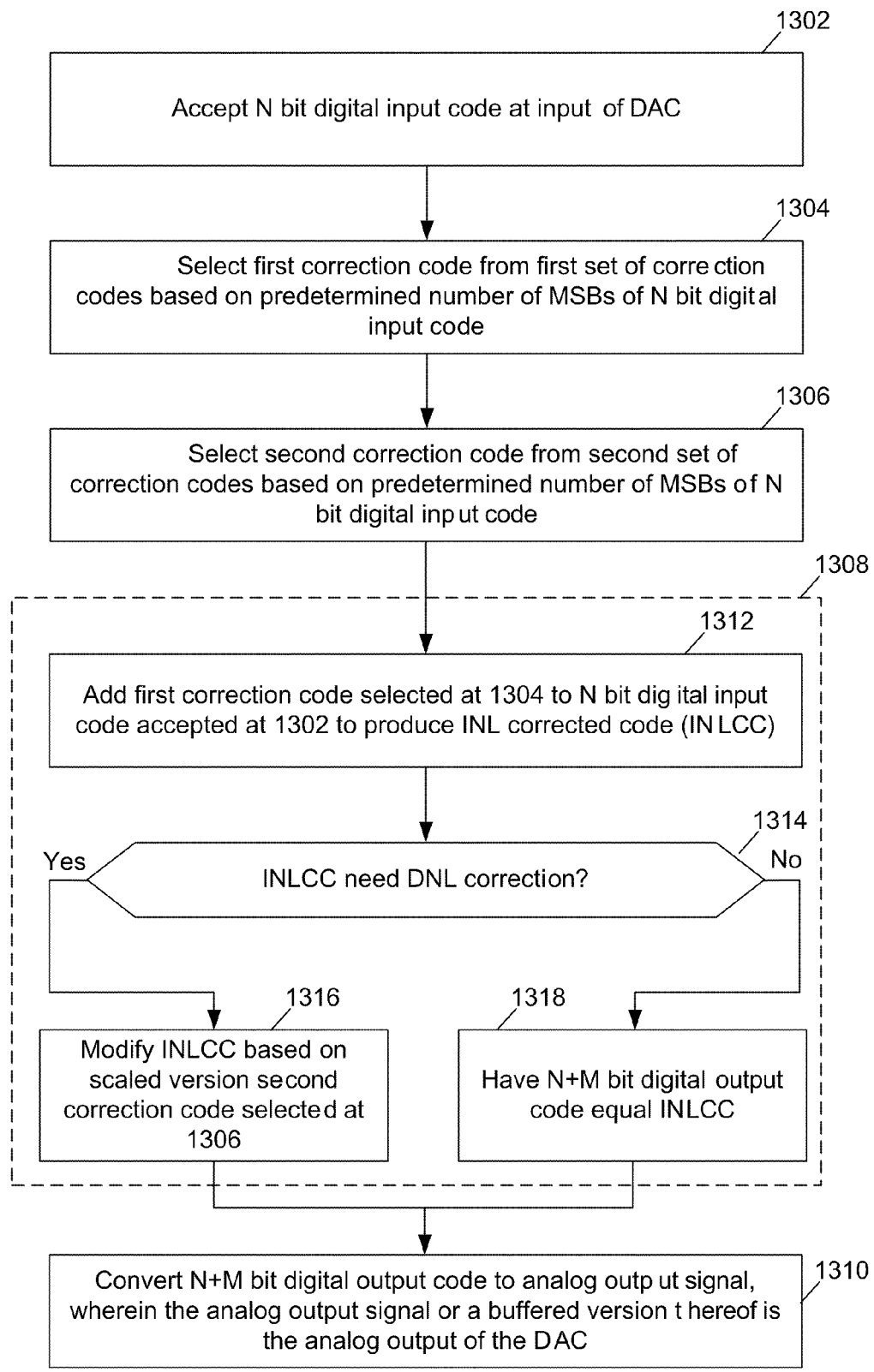
FIG. 13 is a high level diagram that is used to summarize a method for use by a DAC when converting an N bit digital input code to an analog signal.

FIG. 13 is a high level diagram that is used to summarize a method for use by a DAC (for which the method of FIG. 12 has been performed) when converting an N bit digital input code to an analog signal, where N is an integer $\geq 2$, and where N is preferably $\geq 6$, and even more preferably $\geq 8$. Referring to FIG. 13, at step 1302 an N bit digital input code is accepted at an input of the DAC. At step 1304, a first correction code (which can be referred to as an INL correction code) is selected from the first set of correction codes (which can be referred to as a set of INL correction codes) based on a predetermined number (e.g., 4) of the MSBs of the N bit digital input code. At step 1306 a second correction code (which can be referred to as a DNL correction code) is selected from the second set of correction codes (which can be referred to as a set of DNL correction codes) based on the predetermined number (e.g., 4) of the MSBs of the N bit digital input code. At step 1308, an N+M bit digital output code (M is an integer $\geq 1$) is produced based on the accepted N bit digital input code, the selected first correction code, and the selected second correction code. At step 1310, the N+M digital bit output code is converted to an analog output signal. Referring to FIG. 2, step 1310 can be performed by the N+M bit DAC 240. The analog output signal, or a buffered version thereof, is the analog output of the DAC 200.

Referring again to FIG. 13, in accordance with an embodiment, step 1308 can include steps 1312-320. At step 1312, the selected first correction code is added to the accepted N bit digital input code to produce an INL corrected code (INLCC), which is bit extended at step 1314 to produce an N+M bit INLCC (e.g., by concatenating M 0 bit(s) as LSB(s) to the N bit INLCC). At step 1316, there is a determination as to whether the N+M bit INLCC requires DNL correction. This can be accomplished by calculating a range of N+M bit INLCCs that would require DNL correction, and determining whether the N+M bit INLCC is within that range. If the N+M bit INLCC requires DNL correction, then the N+M bit INLCC is modified based on a scaled version second correction code to thereby produce the N+M bit digital output code, as indicated at step 1318. If the N+M bit INLCC does not require DNL correction, then the N+M bit digital output code equals the N+M bit INLCC, as indicated at step 1320.

DACs corrected in accordance with embodiments of the present invention can be used, e.g., in control systems (e.g., motor control), for use with video and audio, for lighting control, for voltage references, but are not limited thereto.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A method for use with a digital-to-analog converter (DAC), the method comprising:
   (a) determining Integrated Non-Linearity (INL) values for a plurality of sub-segments of the DAC that is adapted to accept N bit digital input codes;
   (b) determining a first set of correction codes that can be used to reduce to a range of INL values, to thereby improve linearity of the DAC;
   (c) storing the first set of correction codes in non-volatile memory associated with the DAC so that the first set of correction codes can be accessed during digital-to-analog conversions;
   (d) determining Differential Non-Linearity (DNL) values for the plurality of sub-segments for which INL values were determined at step (a);
   (e) determining a second set of correction codes that can be used to ensure that all values of DNL>−1, to thereby ensure that the DAC is monotonic; and
   (f) storing the second set of correction codes in non-volatile memory associated with the DAC so that the second set of correction codes can be accessed during digital-to-analog conversions.

2. The method of claim 1, wherein steps (a), (b), (c), (d), (e) and (f) are performed during off-line testing of the DAC to improve the linearity of the DAC and ensure that the DAC is monotonic.

3. The method of claim 1, further comprising:
   (g) accepting an N bit digital input code at an input of the DAC;
   (h) selecting a first correction code from the first set of correction codes based on a predetermined number of the most significant bits (MSBs) of the N bit digital input code;
   (i) selecting a second correction code from the second set of correction codes based on the predetermined number of the MSBs of the N bit digital input code;
   (j) producing an N+M bit digital output code based on the N bit digital input code accepted at step (g), the first correction code selected at step (h), and the second correction code selected at step (i); and
   (k) converting the N+M bit digital output code to an analog output signal, wherein the analog output signal or a buffered version thereof is the analog output of the DAC.

4. The method of claim 3, wherein:
   the DAC comprises a plurality of segments, including a most significant segment and a least significant segment, wherein the most significant segment includes 2^X sub-segments implemented by resistors; and
   at steps (h) and (i), the predetermined number of MSBs used to select the first and second correction codes from the first and second sets of correction codes, comprises X MSBs.

5. The method of claim 3, wherein step (j) comprises:
   (j.1) adding the first correction code selected at step (h) to the N bit digital input code accepted at step (g) to produce an N bit INL corrected code (INLCC);
   (j.2) bit extending the N bit INLCC to produce an N+M bit INLCC;
   (j.3) determining whether the N+M bit INLCC requires DNL correction;
   (j.4) if the N+M bit INLCC requires DNL correction, then modifying the N+M bit INLCC based on a scaled version of the second correction code selected at step (i), to thereby produce the N+M bit digital output code; and
   (j.5) if the N+M bit INLCC does not require DNL correction, then having the N+M bit digital output code equal to the N+M bit INLCC.

6. The method of claim 3, wherein:
   step (c) comprises storing the first set of correction codes as an INL correction look-up table (LUT) in non-volatile memory associated with the DAC;
   step (f) comprises storing the second set of correction codes as a DNL correction LUT in non-volatile memory associated with the DAC;

step (h) comprises selecting the first correction code from the INL correction LUT based on the predetermined number of the MSBs of the N bit digital input code; and
step (i) comprises selecting the second correction code from the DNL correction LUT based on the predetermined number of the MSBs of the N bit digital input code.

7. The method of claim 6, wherein:
N=16,
M=1, and
the predetermined number of the MSBs=4.

8. The method of claim 3, wherein step (j) includes using one or more extra bits of resolution to remap at least some of $2^N$ possible digital input codes that can be accepted by the DAC to ensure that all values of DNL>−1.

9. The method of claim 3, wherein step (j) includes using the M bit(s) of additional resolution to compress codes prior to and/or after one or more codes that if uncorrected result in a DNL<−1.

10. The method of claim 1, wherein at step (d) the INL values are measured by a tester.

11. The method of claim 1, wherein at step (d) the DNL values are measured by a tester or are calculated.

12. A method for use with a digital-to-analog converter (DAC), the method comprising:
(a) storing a first set of correction codes that can be accessed during digital-to-analog conversions, wherein the first set of correction codes are used to reduce to a range of Integrated Non-Linearity (INL) values, to thereby improve linearity of the DAC; and
(b) storing a second set of correction codes that can be accessed during digital-to-analog conversions, wherein the second set of correction codes are used to ensure that all values of Differential Non-Linearity (DNL) >−1, and thereby ensure that the DAC is monotonic.

13. The method of claim 12, wherein steps (a) and (b) are performed off-line during testing of the DAC to improve the linearity of the DAC and ensure that the DAC is monotonic.

14. The method of claim 12, further comprising:
(c) accepting an N bit digital input code at an input of the DAC;
(d) selecting a first correction code from the first set of correction codes based on a predetermined number of the most significant bits (MSBs) of the N bit digital input code;
(e) selecting a second correction code from the second set of correction codes based on the predetermined number of the most significant bits (MSBs) of the N bit digital input code; and
(f) producing an N+M bit digital output code based on the N bit digital input code accepted at step (c), the first correction code selected at step (d), and the second correction code selected at step (e).

15. The method of claim 14, wherein step (f) comprises
(f.1) adding the first correction code selected at step (d) to the N bit digital input code accepted at step (c) to produce an N bit INL corrected code (INLCC);
(f.2) bit extending the N bit INLCC to produce an N+M bit INLCC;
(f.3) determining whether the N+M bit INLCC requires DNL correction;
(f.4) if the N+M bit INLCC requires DNL correction, then modifying the N+M bit INLCC based on a scaled version of the second correction code selected at step (e), to thereby produce the N+M bit digital output code; and
(f.5) if the N+M bit INLCC does not require DNL correction, then having the N+M bit digital output code equal to the N+M bit INLCC.

16. A device, comprising:
a code corrector adapted to accept an N bit digital input code and output an N+M bit digital output code based on the N bit digital input code; and
an N+M bit DAC adapted to accept the N+M bit digital code output by the code corrector and output an analog signal based on the accepted N+M bit digital code;
wherein the code corrector includes
a first look-up table (LUT) adapted to store a first set of correction codes used to reduce to a range of Integrated Non-Linearity (INL) values; and
a second look-up table (LUT) adapted to store a second set of correction codes used to ensure that all values of Differential Non-Linearity (DNL)>−1.

17. The device of claim 16, wherein the code corrector is adapted to:
select a first correction code from the first LUT based on a predetermined number of the most significant bits (MSBs) of the N bit digital input code;
select a second correction code from the second LUT based on the predetermined number of the MSBs of the N bit digital input code; and
produce the N+M bit digital output code based on the accepted N bit digital input code, the first correction code selected from the first LUT, and the second correction code selected from the second LUT.

18. The device of claim 17, wherein the N+M bit DAC comprises:
a plurality of segments, including a most significant segment and a least significant segment;
wherein the most significant segment includes $2^X$ sub-segments implemented by resistors; and
wherein the predetermined number of MSBs, used by the code corrector to select the first and second correction codes from the first and second LUTs, comprises X MSBs.

19. The device of claim 17, wherein the code corrector is adapted to:
add the first correction code selected from the first LUT to the accepted N bit digital input code to produce an N bit INL corrected code (INLCC);
bit extend N bit INLCC to produce an N+M bit INLCC;
determine whether the N+M bit INLCC requires DNL correction;
modify the N+M bit INLCC based on a scaled version of the second correction code selected from the second LUT, if the N+M bit INLCC requires DNL correction; and
have the N+M bit digital output code equal to the N+M bit INLCC, if the N+M bit INLCC does not require DNL correction.

20. The device of claim 17, wherein the code corrector comprises and/or has access to non-volatile memory adapted to store the first LUT and the second LUT.

21. The device of claim 17, wherein:
N=16,
M=1, and
the predetermined number of the MSBs=4.

22. The device of claim 16, wherein the first set of correction codes and the second set of correction codes are determined during off-line testing of the N bit DAC.

23. The device of claim 22, wherein the INL values are measured during the off-line testing of the device.

24. The device of claim 23, wherein the DNL values are measured or calculated during the off-line testing of the device.

* * * * *